United States Patent [19]

Verhoeven

[11] Patent Number: 5,104,339
[45] Date of Patent: Apr. 14, 1992

[54] ELECTRICAL CIRCUIT COMPONENT WITH LATCHING MEANS FOR MOUNTING TO A CIRCUIT SUBSTRATE

[75] Inventor: Laurentius M. Verhoeven, RV Veghel, Netherlands

[73] Assignee: E. I. Du Pont de Nemours and Company, Wilmington, Del.

[21] Appl. No.: 595,832

[22] Filed: Oct. 11, 1990

[30] Foreign Application Priority Data

Oct. 11, 1989 [NL] Netherlands .................. 8902522

[51] Int. Cl.⁵ ............................................ H01R 13/60
[52] U.S. Cl. ............................. 439/567; 439/573; 24/453; 24/626
[58] Field of Search ............... 439/549, 552, 555, 557, 439/564, 567, 573, 575, 84; 24/296, 453, 625, 626; 29/739

[56] References Cited

U.S. PATENT DOCUMENTS

| 4,131,982 | 1/1979 | Rose et al. | 439/84 X |
| 4,142,810 | 3/1979 | Lesaint | 439/557 X |
| 4,534,486 | 8/1985 | Eidson | 24/296 X |
| 4,649,633 | 3/1987 | Bocchicchio et al. | 29/739 |
| 4,681,389 | 7/1987 | Nakazawa et al. | 439/557 |

FOREIGN PATENT DOCUMENTS 1393370  2/1965  France .................. 439/557

Primary Examiner—Eugene F. Desmond

[57] ABSTRACT

To latch at circuit component such as a connector to a circuit substrate prior to the soldering, latching members are provided which can be fitted by hand or by machine. The latching member comprises a base part from which at least two resilient legs extend in the same direction. These legs attempt to assume a deflected position with respect to each other as a result of their resiliency. The legs are provided with shoulders for acting onto the circuit substrate in the assembled state. Preferably, the latching member is constructed as an integra wire-type entity. Further, an apparatus for inserting the latching member in a mounting aperture of a circuit component is provided.

9 Claims, 3 Drawing Sheets

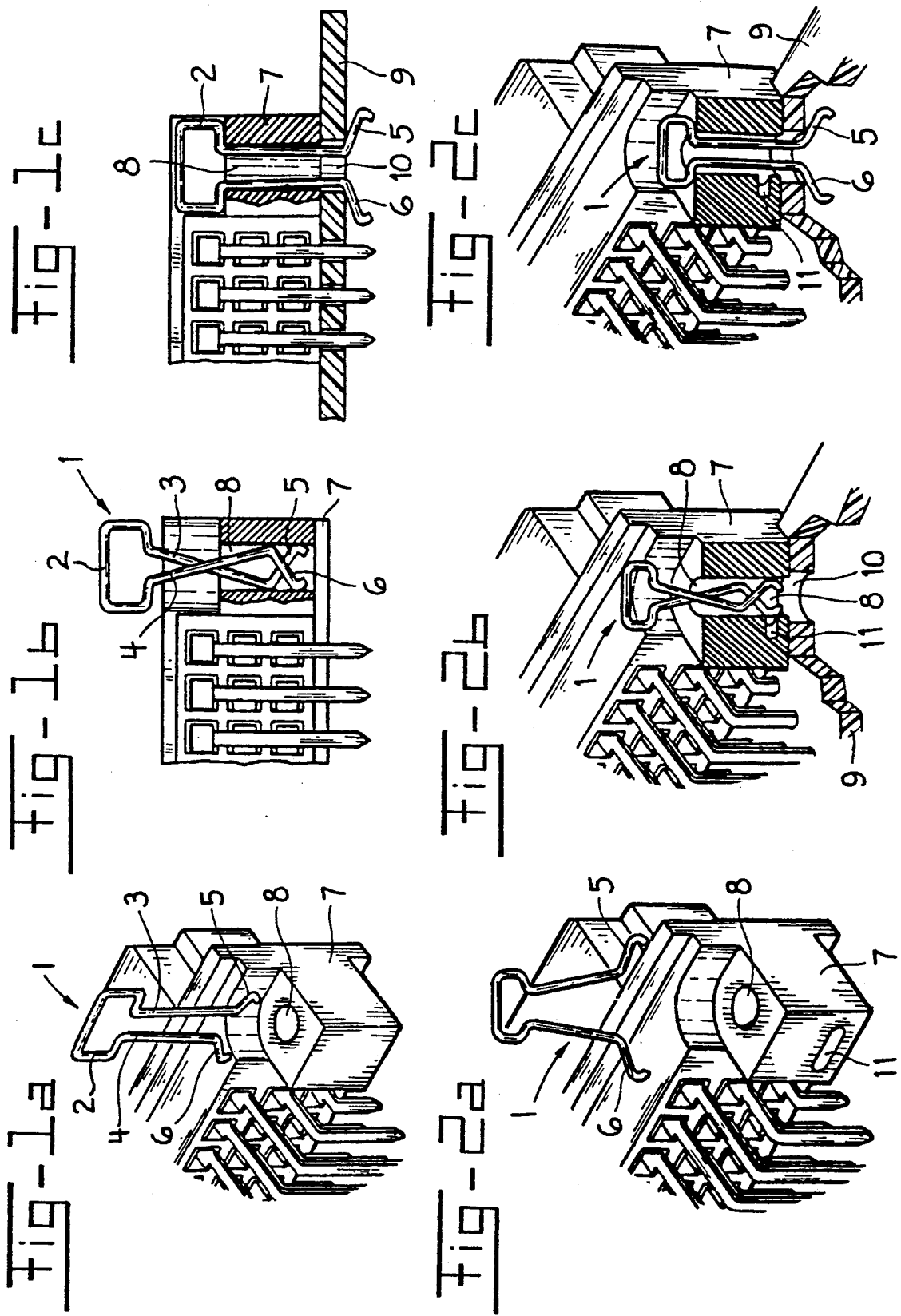

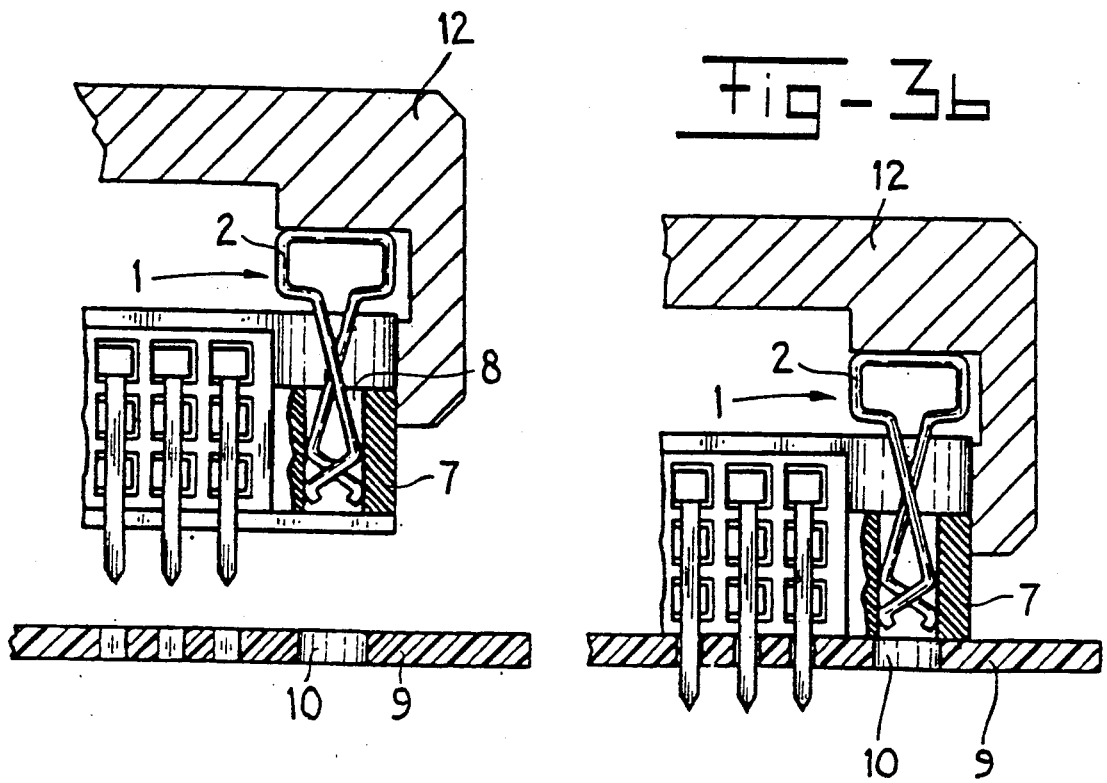
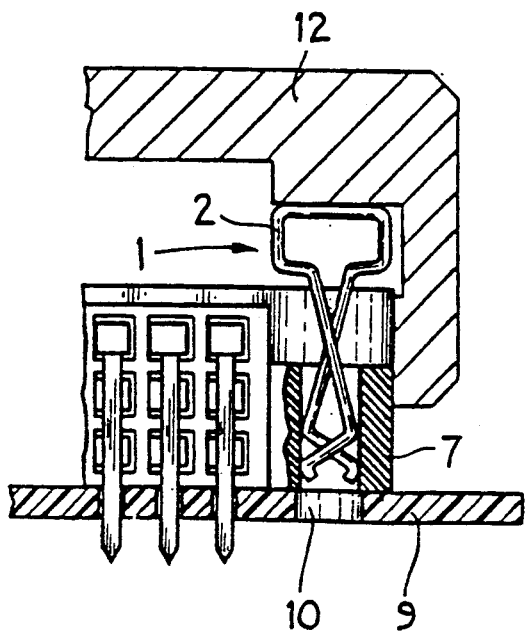
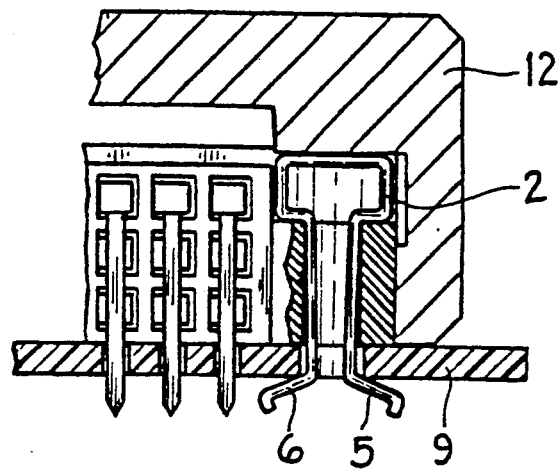

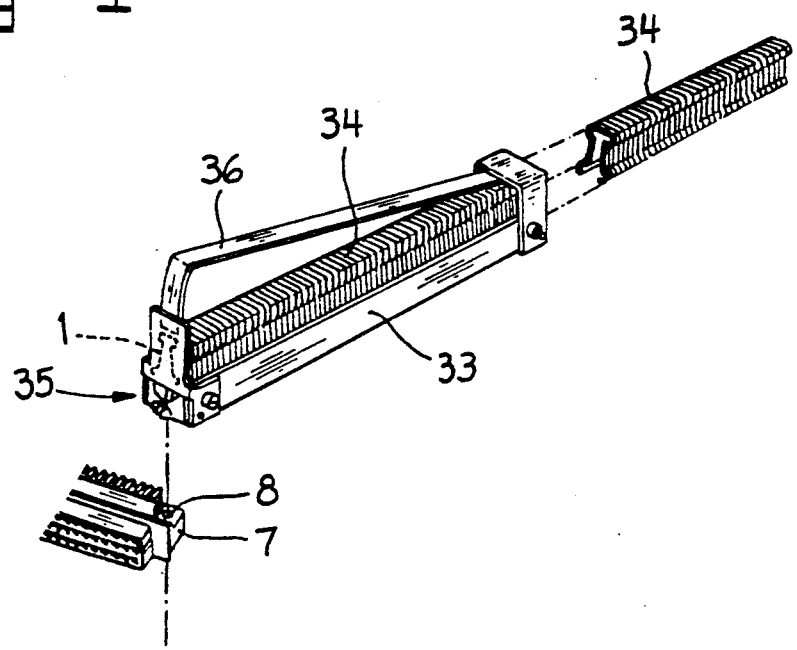
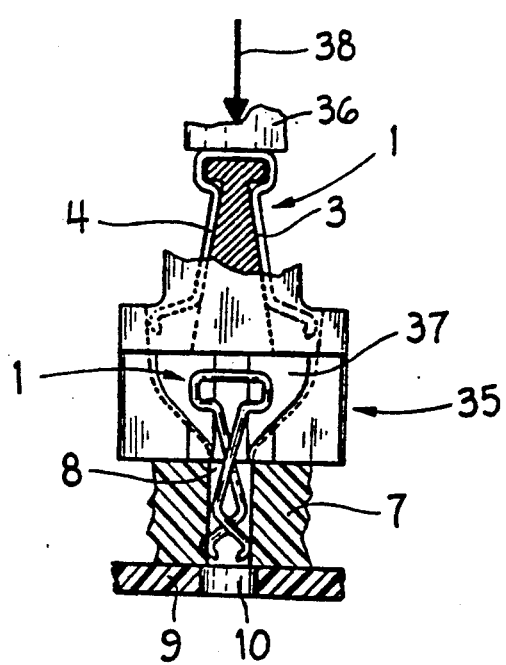

ELECTRICAL CIRCUIT COMPONENT WITH LATCHING MEANS FOR MOUNTING TO A CIRCUIT SUBSTRATE

BACKGROUND OF THE INVENTION

This invention relates to mounting electrical components such as connectors to circuit boards and, more particularly, to providing latching or retaining means for holding such connectors in place.

Prior to soldering, electrical circuit components such as connectors, switches, relays and certain electronic circuit components are generally mounted on a printed circuit board by means of small bolts and nuts or rivets. In many cases, this mounting only serves to hold the respective circuit component in place during soldering in order to prevent faulty soldering connections.

Mounting with small bolts and nuts is relatively expensive and time consuming. The use of rivets requires a special tool. There is also the risk that the circuit component or the printed circuit board may break or crack due to the forces exerted thereon when securing with a rivet. This method of mounting is also relatively expensive.

SUMMARY OF THE INVENTION

This invention provides latching means with which electrical circuit components such as connectors and the like can be latched onto a circuit board very simply and inexpensively from an assembly engineering point of view.

For this purpose, the present invention provides a latching device constructed of a base part which acts on the housing of the circuit component in the assembled state. Two resilient legs extend from the base part in the same direction. The legs attempt to assume a deflected position with respect to each other as a result of their resiliency and are provided with shoulders with which the latching device acts on the circuit board substrate in the assembled state in order to latch the circuit component thereto.

In order to latch an electrical circuit component with the latching device according to the invention, use can be made of the same mounting apertures both in the housings of the circuit device and the substrate which were heretofore intended for receiving small screws and/or rivets. By squeezing the legs of the latching device together against their resiliency, they can easily be introduced into the respective mounting apertures, after which they can be displaced further into the mounting aperture in the direction of the substrate by means of exerting a pressure force on the base part. In the final assembled state, the shoulders of the latching device act against the underside of the circuit substrate while the base part of the latching device acts with a certain force on the circuit component under the influence of the resiliency of the latching device so that the circuit component is firmly held and latched onto the substrate.

Through suitable dimensioning of the resiliency, the risk of breakage or damage to the circuit component and/or the substrate mentioned earlier can be minimized or eliminated. The circuit component also offers, according to the invention, the possibility of being mounted either mechanically or without special tools, for example by hand.

An inexpensive and effective embodiment of the latching device according to the invention is characterized in that the base part and the legs are constructed as a single wire-type entity, the base part being eye-shaped, from which two legs having free ends extend. The shoulders are formed by the divergence of the free ends in the opposite direction at an angle with respect to the longitudinal axis of the legs.

In order to facilitate displacement of the latching device in a mounting aperture and the substrate during assembly, a further embodiment of the invention based on this embodiment is characterized in that the legs, viewed from the base part, are formed in the direction towards each other at the free end beyond the shoulders in order to provide rounded ends.

The latching device according to the invention can be manufactured either from plastic or metal. In order to be able to subject the respective circuit component to a soldering process a plastic with adequate heat resistance should be used. The metal embodiment has the advantage that the respective latching device can, if necessary, be secured by soldering to the substrate in order to effect a rigid mounting of the respective circuit component.

A further advantage of the latching device according to the invention is that it can be provided partially assembled within the circuit component so that no separate latching devices have to be delivered. This is very beneficial both from a cost and an assembly engineering point of view. The invention consequently also relates to an electrical circuit component comprising a housing having one or more mounting apertures, characterized in that a latching device according to one or more of the preceding embodiments is introduced into one or more of the mounting apertures.

Although, as mentioned previously, the latching device according to the invention can be introduced into any desired mounting aperture, a further embodiment of an electrical circuit component for using the latching device according to the invention is characterized in that one or more recesses are provided in the wall of the mounting apertures in order to securely hold the latching device therein in partially assembled form. The components with latching devices therein may be shipped or transferred to the final assembly point where the circuit component is to be mounted on a substrate.

A still further embodiment of an electrical circuit component according to the invention is characterized in that the housing is provided with means which act on the base part for exerting a force on the latching device in order to latch the circuit component onto a substrate.

The invention also relates to an apparatus for inserting the latching devices into a mounting aperture of a circuit component. The apparatus is provided with a magazine for receiving a stack of latching devices. The magazine adjoins a funnel-shaped mouth, means being provided for exerting a force on the base part of a latching device placed in front of the mouth in a manner such that the legs of the latching device are displaced therein starting from the diverging section of the funnel-shaped mouth in order to fit the latching device in a mounting aperture of an electrical circuit component with pre-stressing of the legs.

An apparatus of this type can be provided either for inserting the latching device according to the invention by hand or by machine.

The invention is described in more detail below with reference to several embodiments shown diagrammatically in the drawing.

BRIEF DESCRIPTION OF THE DRAWING

FIG. 1a shows, in perspective, a section of a connector having a latching device according to the invention to be fitted in a mounting aperture of the connector.

FIGS. 1b and 1c show, partly in cross-section, the latching device according to FIG. 1a in the mounting aperture before and after mounting the connector on a substrate.

FIGS. 2a, 2b and 2c show, in perspective, partly in cross-section, the latching device according to FIG. 1 before, during and after mounting respectively, the mounting aperture being provided with a groove for securely holding the latching device.

FIGS. 3a, 3b and 3c show, partially in cross-section, the latching device according to FIG. 1, before and after mounting respectively, means being provided for mounting the latching device.

FIG. 4 shows, in perspective, an embodiment of a device for mounting a latching device according to the invention.

FIG. 5 shows, partly in cross-section, a detail of the device according to FIG. 4 on an enlarged scale.

DETAILED DESCRIPTION OF THE EMBODIMENT

A preferred embodiment of the invention is described below as used with a connector. The invention, however, can be used with other electrical circuit components for the purpose of latching them onto a substrate. Components having the same or a comparable action and/or function are indicated by the same reference numerals.

FIG. 1a shows, in perspective, a preferred embodiment of the latching device according to the invention indicated by reference numeral 1. An eye-shaped base part 2 and legs 3 and 4 are formed as a wire-type entity, for example from a resilient metal or a resilient plastic. The legs 3 and 4 can be deflected with respect to each other due their resiliency. The legs 3 and 4 are provided with shoulders 5 and 6 respectively by deflecting the free ends thereof in the opposite directions at an angle with respect to the longitudinal axis of the legs 3 and 4. At their free ends, the shoulders 5 and 6 are rounded by bending back the free ends in the direction of the longitudinal axis of the legs 3 and 4. The latching device 1 is introduced into the mounting aperture 8 of the housing of a connector 7.

FIG. 1b shows, partly in cross-section, the latching device 1 introduced into the mounting aperture 8, the legs having a certain prestressing determined, inter alia, by the dimensions of the shoulders 5 and 6 and the diameter of the mounting aperture 8. The latching device is introduced into the mounting aperture 8 simply by squeezing the legs 3 and 4 together in an overlapping manner.

FIG. 1c shows, partly in cross-section, the connector housing 7 latched onto a circuit board substrate 9 having a mounting aperture 10 by means of the latching device 1 according to the invention. It can be seen in FIG. 1c that the eye-shaped base part 2 of the latching device 1 acts on the connector housing 7 in the assembled state, while the shoulders 5 and 6 act on the substrate 9 in the vicinity of the mounting aperture 10. Tolerance differences in the thickness of the substrate 9 and the housing 7 at the position of the mounting apertures 8 and 10, and also in the length of the legs 3, 4 can easily be absorbed by the shape of the shoulders which diverges outwards at an angle. The latching device 1 can be removed from the mounting apertures 8 and 10, if desired, by squeezing the legs 3 and 4 together again in an overlapping manner.

FIGS. 2a, 2b and 2c also show a preferred embodiment of the latching device 1. In this embodiment, however, the mounting aperture 8 in the housing 7 of the connector is provided with a recess 11 for securely holding the latching device 1 in the mounting aperture 8 by means of the rounded shoulder ends thereof prior to the latching of the connector onto a substrate (FIG. 2b). The connector may be shipped or transferred with the latching device in this partially assembled state until the connector is positioned at the circuit board for mounting. FIG. 2c shows the connector after it is latched onto the circuit substrate 9 by means of the latching device 1 according to the invention.

FIGS. 3a, 3b and 3c show the mounting of a connector by a mechanical method in one or more mounting apertures 8 in which a latching device 1 according to the invention has previously been inserted. The whole connector is first positioned opposite the desired position on the circuit board substrate 9 by means of an arm 12 of a machine, for example a robot, which acts on the housing 7 of the connector (FIG. 3a). After positioning the connector (FIG. 3b), a force is exerted in the direction of the substrate 9 by means of the arm 12 on the base part 2 of the latching device 1 in order to latch the connector to the circuit substrate. After mounting the connector, the arm 12 is removed again.

The housing 7, if necessary, may be provided with means for exerting a force on the eye-shaped base part 2 of the latching device 1 for latching the housing onto the substrate.

FIG. 4 shows an apparatus with which the latching device according to the invention can easily be mounted. The apparatus comprises a magazine 33 in which a stack of latching devices 34 may be fitted, which magazine 33 merges into a mouth 35. The latching device to be mounted, such as, for example, the latching device 1 according to FIG. 1a of the invention and indicated by broken lines in FIG. 4, is squeezed together and introduced into the mounting aperture 8 of the connector via the mouth 35, the apparatus magazine 33 by exerting a force on the base part of the latching device with the lever 36.

FIG. 5 shows, partly in cross-section, on an enlarged scale, the mouth 35, which has a funnel-shaped part 37 into which the respective latching device 1 is introduced starting from the wide side with its legs 3 and 4. As a result of exerting a force on the latching device 1 with the aid of the lever 36, as shown by the arrow 38, the legs 3 and 4 are squeezed together in order to introduce the latching device 1 into the mounting aperture 8 of the housing 7.

The apparatus according to FIG. 4 can be used for any of the embodiments of the latching device according to the invention by suitably shaping the mouth 35. The device can be made suitable both for manual operation and for machine introduction of latching devices.

The invention can be modified in various ways by a person skilled in the art without departing from the inventive idea in doing so. In this connection, consideration may be given to the shape of the base part, the way in which said base part acts on the circuit component, the shape of the shoulders, the joining of the legs together at, for example, their free ends, etc.

I claim:

1. An electrical circuit component with means for latching said component to a circuit board substrate, comprising:

the circuit component having a housing having at least one aperture for receiving said latching means;

the latching means having at least one wire-like latching member having a base and two resilient legs extending generally in the same direction away from said base in a non-overlapping manner in a non-stressed state, a free end of each leg being flared outward to extend in opposite directions at an angle with respect to the longitudinal axes of the legs to provide a shoulder portion, said legs being insertable into the aperture of the housing and being deflectable toward each other;

wherein said component is an electrical connector with a plurality of terminals and said latching member enables the connector to be held in place on the circuit substrate while the terminals of the connector are soldered to said substrate; and wherein the free ends of the legs of said latching member are rounded so as to extend toward each other after said shoulder portion, and wherein said base is eye-shaped, whereby when said circuit component is placed on a circuit substrate having at least one mounting aperture which is aligned with the aperture in the housing in which said latching member is inserted, said latching member being moveable further downward into the aperture of the housing with the legs deflected in an overlapping manner until the free ends of the legs pass through the mounting aperture in the circuit substrate and deflect away from each other to enable the shoulder portions to act on the substrate and latch the component to the substrate, the base of said latching means in contact with and acting upon said housing.

2. The electrical connector of claim 1, wherein said wire-like member is formed from plastic.

3. The electrical connector of claim 1, wherein said wire-like member is formed from metal.

4. The electrical circuit component of claim 1, wherein said aperture of the housing has at least one recess in a wall thereof to hold the latching member in place prior to latching to the circuit substrate.

5. An apparatus for inserting a wire-like latching member in an aperture of a housing of a circuit component, the latching member having a base and two resilient legs extending in the same direction away from said base, a free end of each of the legs being flared outward to extend in opposite directions at an angle with respect to the longitudinal axes of the legs to provide a shoulder portion, said legs being insertable into the aperture of the housing and being deflectable in an overlapping manner toward each other, the apparatus comprising:

a magazine for receiving a stack of the latching members, the magazine adjoining a funnel-shaped mouth having an inlet for receiving the latching members, one at a time, in a non-stressed state and a narrower outlet for positioning adjacent the housing aperture; and means for exerting a force on the base of an end one of the latching members when the legs of the end latching member are placed adjacent the inlet of the mouth such that the legs of the end latching member are forced into the mouth through the inlet with the legs deflecting toward each other while passing through the mouth until the legs are overlapping one another as they pass through the outlet into the housing aperture of the electrical circuit component.

6. The apparatus of claim 5, wherein the force exerting means is a lever.

7. A latching device for latching an electrical circuit component having a housing aperture to a circuit board substrate having a mounting aperture, the device comprising:

a wire-like latching member having a base and two resilient legs extending generally in the same direction away from the base in a non-overlapping manner in a non-stressed state, a free end of each of the legs being flared outward to extend in opposite directions at an angle with respect to the longitudinal axes of the legs to provide a shoulder portion;

wherein said component is an electrical connector with a plurality of terminals and the latching member enables the connector to be held in place on the circuit substrate while the terminals of the connector are soldered to the substrate; and wherein the free ends of the legs of the latching member are rounded so as to extend toward each other after said shoulder portion, and wherein the base is eye-shaped, whereby when the legs are deflected toward each other in an overlapping manner, they are insertable through the housing aperture and the mounting aperture until the free ends of the legs deflect away from each other to enable the shoulder portions to act on the substrate, the base contacting the electrical circuit component trapping the electrical circuit component and the circuit board substrate between the base and the shoulders latching the component to the substrate.

8. The device of claim 7, wherein the wire-like member is formed from plastic.

9. The device of claim 7, wherein the wire-like member is formed from metal.

* * * * *